United States Patent
Watson et al.

(10) Patent No.: US 8,065,582 B2
(45) Date of Patent: Nov. 22, 2011

(54) FEC STREAMING WITH AGGREGATION OF CONCURRENT STREAMS FOR FEC COMPUTATION

(75) Inventors: Mark Watson, San Francisco, CA (US); Michael G. Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 873 days.

(21) Appl. No.: 11/674,628

(22) Filed: Feb. 13, 2007

(65) Prior Publication Data

US 2007/0189401 A1    Aug. 16, 2007

Related U.S. Application Data

(60) Provisional application No. 60/773,470, filed on Feb. 14, 2006, provisional application No. 60/773,032, filed on Feb. 13, 2006.

(51) Int. Cl.
*H03M 13/05* (2006.01)

(52) U.S. Cl. ............ 714/752; 714/776

(58) Field of Classification Search .......... 714/752, 714/776
See application file for complete search history.

(56) References Cited

U.S. PATENT DOCUMENTS

| | | |
|---|---|---|
| 4,365,338 A | 12/1982 | McRae et al. |
| 5,331,320 A | 7/1994 | Cideciyan et al. |
| 5,432,787 A | 7/1995 | Chethik |
| 5,455,823 A | 10/1995 | Noreen et al. |
| 5,608,738 A | 3/1997 | Matsushita |
| 5,617,541 A | 4/1997 | Albanese et al. |
| 5,805,825 A | 9/1998 | Danneels et al. |
| 5,983,383 A | 11/1999 | Wolf |
| 5,993,056 A | 11/1999 | Vaman et al. |
| 6,073,250 A | 6/2000 | Luby et al. |
| 6,081,909 A | 6/2000 | Luby et al. |

(Continued)

FOREIGN PATENT DOCUMENTS

EP    0 854 650 A2    7/1998

(Continued)

OTHER PUBLICATIONS

Alon et al., "Linear Time Erasure Codes With Nearly Optimal Recovery," Proceedings Of The Annual Symposium On Foundations Of Computer Science, US, Los Alamitos, IEEE Comp. Soc. Press, vol. Symp. 36, pp. 512-516 (Oct. 23, 1995), XP 000557871.

(Continued)

*Primary Examiner* — Stephen M Baker
(74) *Attorney, Agent, or Firm* — Jeffrey D. Jacobs

(57) ABSTRACT

Transmitters and receivers deal with streams of data, wherein the receiver is expected to begin using received data before receiving all of the data. Concurrent streams are sent and FEC coding is used with the streams and done as an aggregate. The transmitter performs FEC operations over the plurality of streams, wherein source blocks from at least two streams logically associated into a jumbo source block and FEC processing is performed to generate one or more jumbo repair block from the jumbo source block. Each of the source blocks comprises one or more source symbols from their respective stream. The jumbo source symbols can be of constant size and are suitably aligned along size boundaries that make processing efficient. Each source symbol need not be the same size, and the number of source symbols from each stream in a jumbo source block need not be the same value across streams.

40 Claims, 4 Drawing Sheets

U.S. PATENT DOCUMENTS

| | | | |
|---|---|---|---|
| 6,081,918 | A | 6/2000 | Spielman |
| 6,163,870 | A | 12/2000 | Luby et al. |
| 6,178,536 | B1 | 1/2001 | Sorkin |
| 6,195,777 | B1 | 2/2001 | Luby et al. |
| 6,307,487 | B1 | 10/2001 | Luby |
| 6,320,520 | B1 | 11/2001 | Luby |
| 6,378,101 | B1 * | 4/2002 | Sinha et al. ............... 714/755 |
| 6,430,233 | B1 | 8/2002 | Dillon et al. |
| 6,671,833 | B2 * | 12/2003 | Pitio ............... 714/701 |
| 6,697,996 | B2 * | 2/2004 | Chethik ............... 714/804 |
| 6,763,494 | B2 * | 7/2004 | Hewitt ............... 714/780 |
| 6,771,674 | B1 * | 8/2004 | Schuster et al. ............... 370/537 |
| 6,868,514 | B2 * | 3/2005 | Kubo et al. ............... 714/755 |
| 7,007,220 | B2 * | 2/2006 | Zhang et al. ............... 714/752 |
| 7,068,729 | B2 | 6/2006 | Shokrollahi et al. |
| 7,127,658 | B2 * | 10/2006 | Cucchi et al. ............... 714/755 |
| 7,296,212 | B1 * | 11/2007 | Hammons, Jr. ............... 714/781 |
| 7,336,666 | B1 * | 2/2008 | Grivna ............... 370/395.51 |
| 7,409,627 | B2 * | 8/2008 | Kim et al. ............... 714/776 |
| 7,466,720 | B2 * | 12/2008 | Bentz et al. ............... 370/466 |
| 7,512,867 | B2 * | 3/2009 | Ohira et al. ............... 714/786 |
| 7,734,176 | B2 * | 6/2010 | Mishra et al. ............... 398/47 |
| 2001/0019310 | A1 | 9/2001 | Luby |
| 2004/0075593 | A1 | 4/2004 | Shokrollahi et al. |
| 2005/0257106 | A1 | 11/2005 | Luby et al. |

FOREIGN PATENT DOCUMENTS

| | | |
|---|---|---|
| WO | WO 96 34463 A | 10/1996 |

OTHER PUBLICATIONS

Bigloo et al. "A Robust Rate-Adaptive Hybrid ARQ Scheme For Frequency-Hopped Spread-Spectrum Multiple-Access Communication Systems" IEEE Journal On Selected Areas in Communications, US, IEEE Inc, New York, (Jun. 1, 1994) pp. 917-924, XP0000464977.

Blömer et al., "An XOR-Based Erasure-Resilient Coding Scheme," ICSI Technical Report No. TR-95-048 (1995) [avail. at ftp://ftp.icsi.berkeley.edu/pub/techreports/1995/tr-95-048.pdf].

Byers et al., "A Digital Fountain Approach to Reliable Distribution of Bulk Data"; Computer Communication Review, Association for Computing Machinery, 1998, vol. 28, No. 4, pp. 56-67.

Byers et al., "Accessing Multiple Mirror Sites in Parallel: Using Tornado Codes to Speed Up Downloads,"; Eighteenth Annual Joint Conference of the IEEE Computer and Communications Societies, pp. 275-283.

Byers et al. "Accessing Multiple Mirror Sites In Parallel: Using Tornado Codes To Speed Up Downloads" Proceeding IEEE Infocom. The Conference On Computer Communications, US New York, (Mar. 21 1999) pp. 275-283, XP000868811.

Clark et al., "Error Correction Coding for Digital Communications, System Applications"; Plenum Press, New York, 1981, pp. 339-341.

Esaki et al. "Reliable IP Multicast Communication Over ATM Networks Using Forward Error Correction Policy" IEICE Transactions On Communications, JP, Institute of Electronics Information and Comm. ENG. Tokyo, vol. E78-V, No. 12, (Dec. 1995), pp. 1622-1637, XP000556183.

Luby et al., "Analysis of Low Density Codes and Improved Designs Using Irregular Graphs", International Computer Science Institute Technical Report TR-97-045 (Nov. 1997) [available at ftp://ftp.icsi.berkeley.edu/pub/techreports/1997/tr-97-045.pdf].

Luby et al., "Analysis of Random Processes via And-Or Tree Evaluation," ICSI Technical Report No. TR-97-042 (1997) and Proceedings of the 9th Annual ACM Symposium on Discrete Algorithms (1998) [available at ftp://ftp.icsi.berkeley.edu/pub/techreports/1997/tr-97-042.pdf].

Luby et al., "Efficient Erasure Correcting Codes", IEEE Transactions on Information Theory, vol. 47, No. 2, 2001, pp. 569-584.

Luby et al., "Improved Low-density Parity-Check Codes Using Irregular Graphs and Belief Propagation", International Computer Science Institute Technical Report TR-97-044 (Nov. 1997) [available at ftp://ftp.icsi.berkeley.edu/pub/techreports/1997/tr-97-044.pdf].

Luby et al., "Tornado Codes,"*Practical Loss-Resilient Codes*, 29th Annual ACM Symposium on Theory of Computing (1997).

Pursley et al. "Variable-Rate Coding for Meteor-Burst Communications" IEEE Transactions on Communications, US, IEEE Inc. New York (1989) vol. 37, No. 11, pp. 1105-1112, XP000074533.

Rizzo, "Effective Erasure Codes for Reliable Computer Communication Protocols", Computer Communixcation Review Association for Computing Machinery vol. 27, No. 2, pp. 24-36.

Seshan el al. "Handoffs In Cellular Wireless Networks: The Daedalus Implementation and Experience" Wireless Personal Communications, NL, Kluwer Academic Publishers, vol. 4, No. 2, Mar. 1, 1997, pp. 141-162, XP000728589.

Shacham, N., "Packet Recovery And Error Correction In High-Speed Wide-Area Networks," Proceedings Of The Military Communications Conference. (Milcom), US, New York, IEEE, vol. 1, pp. 551-557, (1989), XP 000131876.

Shu, et al., "Error Control Coding-Fundamentals and Applications", Englewood Cliffs, 1983 pp. 288.

3GPP TS 26.346 V6.7.0 (Dec. 2006) 3rd Generation Partnership Project; Technical Specification Group Services and System Aspects; Multimedia Broadcast/Multicast Service (MBMS); Protocols and codecs (Release 6).

International Search Report and Written Opinion—PCT/US2007/062087, International Search Authority—European Patent Office—Aug. 11, 2007.

* cited by examiner 10, 12, 16, 20, 25, 32, 40, 50, 64, 80, 100, 125, 160, 200, 250, 320, 400, 500, 640, 800, 1000, 1250, 1600, 2000, 2500, 3200, 4000, 5000, 6400, 8000

| T (bytes) | 20% protection with scheduling (Mbps) | 20% protection no scheduling (Mbps) | 10% protection with scheduling (Mbps) | 10% protection no scheduling (Mbps) |
|---|---|---|---|---|
| 32 | 88 | 220 | 95 | 262 |
| 64 | 167 | 379 | 179 | 449 |
| 128 | 248 | 425 | 272 | 500 |
| 256 | 314 | 425 | 333 | 463 |
| 512 | 388 | 464 | 416 | 504 |
| 1024 | 504 | 563 | 535 | 610 |
| 1280 | 533 | 587 | 573 | 634 |
| 2048 | 583 | 621 | 631 | 678 |

FIG. 5

FEC STREAMING WITH AGGREGATION OF CONCURRENT STREAMS FOR FEC COMPUTATION

CROSS REFERENCE

This application claims priority from and is a non-provisional of U.S. Provisional Patent Application No. 60/773,032 filed Feb. 13, 2006 and U.S. Provisional Patent Application No. 60/773,470 filed Feb. 14, 2006.

The following references are include here and are incorporated by reference for all purposes:

U.S. Pat. No. 6,307,487 entitled "Information Additive Code Generator and Decoder for Communication Systems" issued to Luby (hereinafter "Luby"); and U.S. Pat. No. 7,068,729 issued to Shokrollahi et al. entitled "Multi-Stage Code Generator and Decoder for Communication Systems" (hereinafter "Shokrollahi").

FIELD OF THE INVENTION

The present invention relates to encoding and decoding data in communications systems and more specifically to communication systems that encode and decode data to account for errors and gaps in communicated data while dealing with multiple streams of data over a channel. Communication is used in a broad sense, and includes but is not limited to transmission of digital data of any form through space and/or time.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

Data transmission is straightforward when a transmitter and a receiver have all of the computing power and electrical power needed for communications and the channel between the transmitter and receiver is clean enough to allow for relatively error-free communications. The problem of data transmission becomes more difficult when the channel is in an adverse environment or the transmitter and/or receiver has limited capability.

One solution is the use of forward error correcting (FEC) techniques, wherein data is coded at the transmitter such that a receiver can recover from transmission erasures and errors. Where feasible, a reverse channel from the receiver to the transmitter allows for the receiver to communicate about errors to the transmitter, which can then adjust its transmission process accordingly. Often, however, a reverse channel is not available or feasible or is available only with limited capacity. For example, where the transmitter is transmitting to a large number of receivers, the transmitter might not be able to handle reverse channels from all those receivers. As another example, the communication channel may be a storage medium and thus the transmission of the data is forward through time and, unless someone invents a time travel machine that can go back in time, a reverse channel for this channel is infeasible. As a result, communication protocols often need to be designed without a reverse channel or with a limited capacity reverse channel and, as such, the transmitter may have to deal with widely varying channel conditions without a full view of those channel conditions.

The problem of data transmission between transmitters and receivers is made more difficult when the receivers need to be low-power, small devices that might be portable or mobile and need to receive data at high bandwidths. For example, a wireless network might be set up to deliver files or streams from a stationary transmitter to a large or indeterminate number of portable or mobile receivers either as a broadcast or multicast where the receivers are constrained in their computing power, memory size, available electrical power, antenna size, device size and other design constraints. Another example is in storage applications where the receiver retrieves data from a storage medium which exhibits infidelities in reproduction of the original data. Such receivers are often embedded with the storage medium itself in devices, for example disk drives, which are highly constrained in terms of computing power and electrical power.

In such a system, considerations to be addressed include having little or no reverse channel, limited memory, limited computing cycles, power, mobility and timing.

In the case of a packet protocol used for data transport over a channel that can lose packets, a file, stream or other block of data to be transmitted over a packet network is partitioned into equal size input symbols, encoding symbols the same size as the input symbols are generated from the input symbols using an FEC code, and the encoding symbols are placed and sent in packets. The "size" of a symbol can be measured in bits, whether or not the symbol is actually broken into a bit stream, where a symbol has a size of M bits when the symbol is selected from an alphabet of $2^M$ symbols. In such a packet-based communication system, a packet oriented erasure FEC coding scheme might be suitable. A file transmission is called reliable if it allows the intended recipient to recover an exact copy of the original file even in the face of erasures in the network. A stream transmission is called reliable if it allows the intended recipient to recover an exact copy of each part of the stream in a timely manner even in the face of erasures in the network. Both file transmission and stream transmission can also be somewhat reliable, in the sense that some parts of the file or stream are not recoverable or for streaming if some parts of the stream are not recoverable in a timely fashion. Packet loss often occurs because sporadic congestion causes the buffering mechanism in a router to reach its capacity, forcing it to drop incoming packets. Protection against erasures during transport has been the subject of much study.

In the case of a protocol used for data transmission over a noisy channel that can corrupt bits, a block of data to be transmitted over a data transmission channel is partitioned into equal size input symbols, encoding symbols of the same size are generated from the input symbols and the encoding symbols are sent over the channel. For such a noisy channel the size of a symbol is typically one bit or a few bits, whether or not a symbol is actually broken into a bit stream. In such a communication system, a bit-stream oriented error-correction FEC coding scheme might be suitable. A data transmission is called reliable if it allows the intended recipient to recover an exact copy of the original block even in the face of errors (symbol corruption, either detected or undetected in the channel). The transmission can also be somewhat reliable, in the sense that some parts of the block may remain corrupted after recovery. Symbols are often corrupted by sporadic noise, periodic noise, interference, weak signal, blockages in the channel, and a variety of other causes.

Chain reaction codes are FEC codes that allow for generation of an arbitrary number of output symbols from the fixed input symbols of a file or stream. Sometimes, they are referred to as fountain or rateless FEC codes, since the code does not have an a-priori fixed transmission rate and the number of possible output symbols can be independent of the number of input symbols. Novel techniques for generating, using and operating chain reaction codes are shown, for example, in Luby and Shokrollahi.

It is also known to use multi-stage chain reaction ("MSCR") codes, such as those described in Shokrollahi and developed by Digital Fountain, Inc. under the trade name "Raptor" codes. Multi-stage chain reaction codes are used, for example, in an encoder that receives input symbols from a source file or source stream, generates intermediate symbols from the input symbols and the intermediate symbols are the source symbols for a chain reaction encoder.

For some applications, other variations of codes might be more suitable or otherwise preferred. As used herein, input symbols refer to the data received from a file or stream and source symbols refer to the symbols that are used to generate output symbols. In some cases, the source symbols include the input symbols and in some cases, the source symbols are the input symbols. However, there are cases where the input symbols are encoded and/or transformed into an intermediate set of symbols and that intermediate set is used to generate the output symbols without reference to the input symbols (directly). Thus, input symbols comprise information known to the sender which is to be communicated to the receiver, source symbols are the symbols used by at least one stage of an encoder and are derived from the input symbols, and output symbols comprise symbols that are transmitted by the sender to the receiver.

In some applications, the receiver may begin to use the data before the transmission is complete. For example, with a video-on-demand system, the receiver might start playing out a video after only a small portion of the video data is received and assume that the rest of the video data will be received before it is needed. In such systems, encoding should not be done over the entire transmission, because then some output symbols at the end of the transmission might encode for input symbols needed at the beginning of the video, in which case those output symbols are wasteful since their information is needed when it is not available and is not needed when it is available. To avoid this, the data stream is typically divided into blocks wherein the input data of the block is encoded and sent before the next block is prepared and blocks normally do not depend on input symbols outside those blocks.

There are tradeoffs with the use of blocks: too small a block size and not enough error protection is provided, whereas too large a block size and too much delay is seen at the receiver as it waits for blocks to be completely recovered.

SUMMARY OF THE INVENTION

In embodiments of the present invention, transmitters and receivers deal with streams of data, wherein the receiver is expected to begin using received data before all of the data is transmitted and received, and further concurrent streams are sent and FEC coding is used with the streams and done as an aggregate. Thus, a transmitter sending out a plurality of streams will perform FEC operations over the plurality of streams, wherein source blocks from each of the plurality of streams (or a subset of two or more of the plurality of streams) are logically associated into a jumbo source block and FEC processing is performed to generate one or more jumbo repair block from the jumbo source block. Each of the source blocks comprises one or more source symbols from their respective stream. The source symbols are logically (and/or physically) grouped into a jumbo source symbol.

In a preferred embodiment, the jumbo source symbols are of constant size and are suitably aligned along size boundaries that make processing efficient. Each source symbol need not be the same size, and the number of source symbols from each stream in a jumbo source block need not always be the same value across streams.

At the receiver, the receiver logically (and/or physically) receives and determines repair symbols for one of the streams from the plurality of streams encoded as a jumbo source block, and uses the received repair symbols (possibly together with some received source symbols) to repair lost or garbled (or not sent) source symbols from that stream.

According to yet another embodiment of the invention, a computer data signal embodied in a carrier wave is provided.

Numerous benefits are achieved by way of the present invention. For example, in a specific embodiment, the computational expense of encoding data for transmission over a channel is reduced. In another specific embodiment, the computational expense of decoding such data is reduced. In yet another specific embodiment, the error probability of the decoder is reduced, while keeping the computational expense of encoding and decoding low. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

BRIEF DESCRIPTION OF THE DRAWINGS

FIG. 2 is a sample table of list values usable for encoding according to aspects of embodiments of the present invention.

FIG. 3 is another sample table of list values usable for encoding according to aspects of embodiments of the present invention.

FIG. 4 illustrates an example of a jumbo source block according to one embodiment of the present invention.

FIG. 5 is a table showing encoding statistics for implementations of encoders according to embodiments of the present invention.

DETAILED DESCRIPTION OF THE INVENTION

Figure 1:
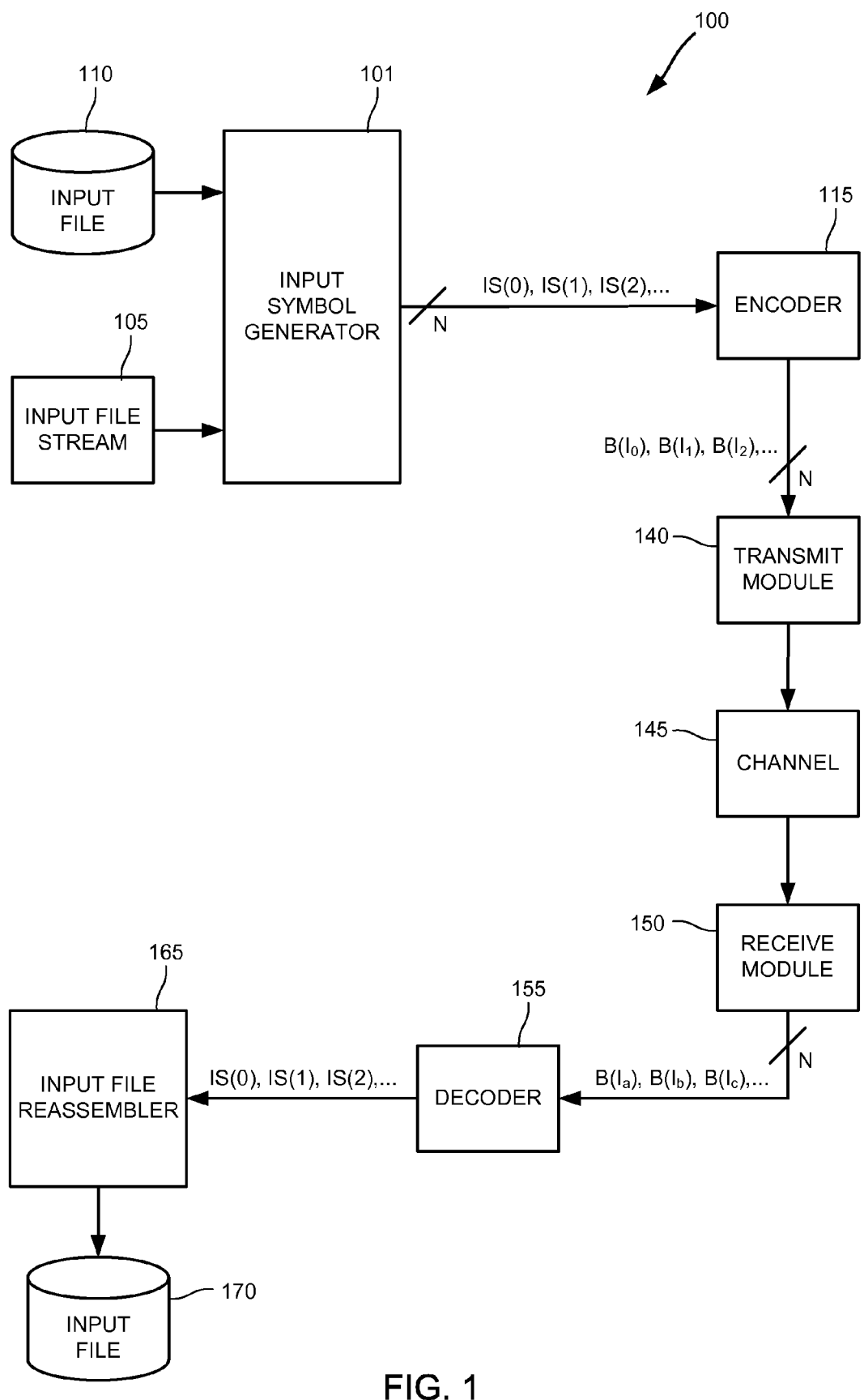
FIG. 1 is a block diagram of a communications system according to one embodiment of the present invention.

A highly scalable streaming FEC architecture, i.e., an FEC encoder architecture is described that can scale to support FEC encoding of many concurrent streams of data, each stream potentially diverse in its FEC structure and completely independent data and blocking structure used in each stream, each stream potentially a high rate stream, all supported within a single computational platform using moderate CPU and memory resources.

File/Stream Encoding

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

As used herein, the term "stream" refers to any data that is stored or generated at one or more sources and is delivered at a specified rate at each point in time in the order it is generated to one or more destinations. Streams can be fixed rate or variable rate. Thus, an MPEG video stream, AMR audio stream, and a data stream used to control a remote device, are all examples of "streams" that can be delivered. The rate of the stream at each point in time can be known (such as 4 megabits per second) or unknown (such as a variable rate stream where the rate at each point in time is not known in advance). Either way, the stream is a sequence of input symbols, where each input symbol has a position in the stream and a value.

Transmission is the process of transmitting data from one or more senders to one or more recipients through a channel in order to deliver a file or stream. A sender is also sometimes referred to as the encoder. If one sender is connected to any number of recipients by a perfect channel, the received data can be an exact copy of the input file or stream, as all the data will be received correctly. Here, we assume that the channel is not perfect, which is the case for most real-world channels. Of the many channel imperfections, two imperfections of interest are data erasure and data incompleteness (which can be treated as a special case of data erasure).

In some communication systems, a recipient receives data generated by multiple senders, or by one sender using multiple connections. In some cases, a channel is divided into subchannels and symbols are more or less independently sent through the subchannels.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file or stream, but instead to transmit data generated from the input file or stream (which could include all or parts of the input file or stream itself) that assists with recovery of erasures. An encoder is a circuit, device, module or code segment that handles that task. One way of viewing the operation of the encoder is that the encoder generates output symbols from input symbols, where a sequence of input symbol values represents the input file or a block of the stream. Each input symbol would thus have a position, in the input file or block of the stream, and a value. A decoder is a circuit, device, module or code segment that reconstructs the input symbols from the output symbols received by the recipient. In multi-stage coding, the encoder and the decoder are further divided into sub-modules each performing a different task.

Using Jumbo Source Blocks

As explained above, an encoder generates output symbols from source symbols and where the receiver is expected to begin to use transmitted data before it receives all of the data it needs, the source symbols are grouped into blocks such that a block can be normally encoded, sent and decoded without the receiver having to depend on information conveyed in a later block. While data in the later block could be dependent on source symbols of an earlier block, such dependencies would likely be wasteful as they would be using computing effort and bandwidth sending data that is needed when it is not available and/or is not needed when it is available. Herein, the typical example is data transmission wherein a block does not normally depend on data of another block.

Where the receiver is expected to begin using received data before all of the data is transmitted and received, this is sometimes referred to as streaming. It is often useful to use concurrent streams of a plurality of subchannels. The data of a stream on a subchannel can be FEC coded, i.e., where the data sent over that subchannel is usable to recover other data of that subchannel because there is some dependency. A simple example is where the data on a subchannel comprises source symbols and redundant symbols that have values determined from a calculation performed on that subchannel's source symbols. Where blocking is used, the calculations only depend on the source symbols for the block to which the redundant symbols belong.

In embodiments of encoders/decoders and communication systems described herein, jumbo source blocks are defined and some output symbols are calculated from jumbo source blocks, wherein a jumbo source block comprises source blocks from at least two of a plurality of streams, possibly over all streams, such that FEC processing is performed to generate one or more jumbo repair block from the jumbo source block with jumbo repair blocks having dependencies across streams. Each of the source blocks comprises one or more source symbols from their respective stream. The source symbols are logically (and/or physically) grouped into a jumbo source symbol.

The jumbo source symbols can be of constant size and suitably aligned along size boundaries that make processing efficient. Each source symbol need not be the same size, and the number of source symbols from each stream in a jumbo source block need not always be the same value across streams. A receiver logically (and/or physically) receives and determines repair symbols for one of the streams from the plurality of streams encoded as a jumbo source block, and uses the received repair symbols (possibly together with some received source symbols) to repair lost or garbled (or not sent) source symbols from that stream.

As an example, suppose a channel is divided into 64 subchannels and each carries a stream of data output by an encoder and that data is FEC encoded. Suppose further that each stream is sent at a constant bit rate of 8 Mbps. Using conventional techniques, the FEC encoding of each of the 64 streams would proceed independently of all other streams, executing separate logic and using separate memory and CPU resources (and proceeding as a separate thread or process), contending for usage of these common resources with all the other streams.

However, when jumbo blocks are used, an FEC encoder operates on a single jumbo source block that contains data from potentially many different streams to efficiently encode all the streams as if though they were a single stream, thereby yielding a much more efficient and scalable solution for protecting streams using FEC encoding.

In the example given, suppose further that an encoder (such as a computer with a CPU, inputs and outputs) receives data as 64 separate streams and performs FEC encoding on the 64 streams as they flow through, and the resulting 64 FEC encoded streams are concurrently sent. Suppose further that the streams arriving at the input to the encoder are in packets that contain 1000 bytes of data each, and at each 100 ms interval all the current 64 source blocks for the 64 streams are deemed to be completed and a new source block is initiated for each of the 64 streams. Suppose the FEC code is a systematic code, and each source block for each stream comprises 100 packets of data, where each packet of data can be considered as a single symbol of the FEC code that is 1000 bytes in size. The original source packets for each of the 64 streams can be sent to the individual receivers for these 64 streams with little or no modification.

Instead of adding each source symbol for the 64 streams to the appropriate one of 64 source blocks and processing each of these 64 source blocks separately, the data for each of the 64 source blocks can be instead added in an appropriate place to a jumbo source block that has 100 jumbo source symbols, where each jumbo symbol size is the sum of the sizes of the symbol sizes from each of the 64 source blocks, i.e., the jumbo symbol size is 64000 bytes, where the first 1000 bytes of each jumbo symbol corresponds to a symbol in the first stream, and in general the ith 1000 bytes of each jumbo symbol corresponds to a symbol in the ith stream. Then, the jumbo source block containing 100 jumbo symbols of 64000 bytes each is processed as a single entity by the FEC encoder to generate jumbo repair symbols, where each jumbo repair symbol is 64000 bytes in length and can be thought of as the concatenation of 64 repair symbols, one for each of the 64 source blocks of the 64 streams. This FEC encoding can be performed using a single process, executing the encoding logic once that is then applied to jumbo symbols once for all 64 streams instead of executed individually for each of the 64 streams applied to symbols.

Once the jumbo repair symbols are generated, each resulting jumbo repair symbol can be easily repartitioned into 64 separate repair symbols of size 1000 bytes, one for each of the 64 streams, and each of the 64 repair symbols can be placed into a packet that is addressed and sent to the appropriate receiver among the 64 receivers. Thus, there is logic to send as is (or with little modification) the source packets for the original streams, while also multiplexing the data in the source packets from the many incoming streams into a single jumbo source block, use a single FEC encoder to generate jumbo repair symbols from the jumbo source block, and then to parse out the repair symbols for each of the many streams and place them into repair packets and send them to the appropriate receiver of each stream.

Communication System in Which Jumbo Blocks can be Used

FIG. 1 is a block diagram of a communications system 100 that can be used to encode data using jumbo blocks. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). The possible values for input symbols, i.e., its alphabet, is typically an alphabet of $2^M$ symbols, so that each input symbol codes for M bits of the input file or stream. The value of M is generally determined by the use of communication system 100, but a general purpose system might include a symbol size input for input symbol generator 110 so that M can be varied from use to use. The output of input symbol generator 110 is provided to an encoder 115.

Encoder 115 receives the input symbols (or in other cases not shown, receives source symbols from a prior processing stage that processed the input symbols), and then generates the output symbols, each with a value B(I), from the input or source symbols. The inputs to encoder 115 and the outputs from encoder 115 are multiplexed to handle multiple streams. In the figure, this is denoted by the value N, and thus in the example above, N=64.

The value of each output symbol is generated based on some function of one or more of the input symbols, and possibly on one or more redundant symbols that had been computed from the input symbols. Typically, but not always, M is the same for input symbols and output symbols, i.e., they both code for the same number of bits.

Encoder 115 provides output symbols to a transmit module 140. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The traffic between module 140 and module 150 might be delineatable into subchannels, or not.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, which recovers the input symbols (again IS(0), IS(1), IS(2), . . . ). Decoder 155 provides the recovered input symbols to an input file reassembler 165, which generates a copy 170 of input file 101 or input stream 105. In cases described herein, input file reassembler 165 begins to output data before receiving all of the input symbols.

Luby and Shokrollahi provide teachings of systems and methods that can be employed in certain embodiments where chain reaction and MSCR codes are used. It is to be understood, however, that these systems and methods are not required of the present invention, and many other variations, modifications, or alternatives can also be used.

Processing Symbols That Represent Atomic Symbols

One property that many FEC erasure codes have is that a symbol represents independent atomic symbols that are much smaller than the symbol. The atomic symbols of the symbol do not interact with one another, i.e., each atomic symbol position of a symbol forms a valid FEC code over the atomic symbols in that position independent of all the other atomic symbol positions. For example, a Reed-Solomon code is typically applied to field elements of one byte (over GF[256]), and thus a field element can be thought of as an atomic symbol of the code.

A symbol in an erasure-based application may comprise many of these field elements, e.g., 128-byte symbols where each byte position in the symbol can be thought of as a separate input to be encoded using a Reed-Solomon code. In that example, computing the encoding of 128-byte symbols involves 128 parallel applications of the same Reed-Solomon code steps to the 128 byte positions of the symbol. In that example, such a Reed-Solomon code encoder uses symbols that comprise one-byte atomic symbols. As another example, the FEC code described in Annex B and E of the 3GPP Specification TS 26.346 (Release 6) (hereinafter "3GPP Specification") has atomic symbols that are one bit in length, since the encoding and decoding operations do not inter-mix information between the different bit positions of a symbol. For example, processing a symbol of 1024 bytes using such codes can be thought of as 8192 parallel applications of a code process that operates on a single bit.

A reason for using symbols that are the concatenation of many atomic symbols is for efficiency reasons, e.g., the same set of operations is applied to all the atomic symbols of a symbol, and in general it is much more efficient to apply the same set of operations to entire symbols instead of individually to all the atomic symbols of the symbol.

There are several reasons that it is desirable to have symbols of atomic symbols that do not vary in size as the symbol size varies. One reason is described in the previous paragraph. Another reason is motivated by the following example: Suppose an application wants to use symbols that are 188 bytes in length, but the FEC encoding and decoding is more efficient with 192 byte symbols (because for example the largest power of two that divides 192 is 64, whereas for 188 it is only 4). Using a FEC code with atomic symbols of four bytes or less, it is possible to protect a single stream using the FEC code by processing the 188-byte symbol as a 192-byte symbol and ignore the other four bytes and process such that the values used for processing the 188-byte symbol are not affected by arbitrary assignments of the other four bytes.

This will now be illustrated in the following process ("Jumbo Source Block Method 1"):

At the sender:
(1) For each source block, take the original source symbols of 188 bytes and put them into the source block aligned on memory boundaries that are multiples of 192 bytes, e.g., the first 188 byte symbol starts at byte 0, the second 188 symbol starts at byte 192, the third 188 byte symbol starts at byte 384, etc. The last four bytes of each symbol can be padded out with zeroes or filled with any arbitrary values.
(2) Send the original source symbols of 188 bytes each for the source block.
(3) Generate 192 byte repair symbols from the source block.
(4) Send only the first 188 bytes of each 192 byte repair symbol for the source block.

At the receiver:
(1) For each source block, receive source symbols of 188 bytes each and place them into their proper position in a source block that has 192 byte symbols. The last four bytes of each symbol can be padded out with zeroes or filled with any arbitrary values.
(2) Receive repair symbols of 188 bytes each and align them on memory boundaries that are multiples of 192 bytes. The last four bytes of each symbol can be padded out with zeroes or filled with any arbitrary values.
(3) Decode the 192 byte source symbols of the source block.
(4) Deliver to the application or higher level process the first 188 bytes of each 192 byte source symbol in the source block.

With Jumbo Source Block Method 1, the encoding and decoding are performed on the preferred symbol size of 192 bytes, but each "communicated" symbol (symbols that are transmitted by the sender, or passed on to the application at the receiver after FEC decoding) is of the original symbol size of 188 bytes. Note that the above logic produces the correct result for an FEC code with symbols that are made up of atomic symbols that are at most 4 bytes in size, independent of the value of the 4 bytes of padding at the end of each 192 byte computational symbol, and independent of whether or not these padding bytes are the same at the sender and the receiver. As one of many variants of the above, the sender may work with 192 byte symbols during computation as described above, but the receiver may work with the original size of 188 bytes for all symbols during its computations, i.e., the receiver might not pad symbols out, and still the source block will be correctly recovered at the receiver as long as the receiver receives enough correct symbols for the source block.

Note that no timing is implied in the above procedure descriptions, e.g., source symbols may be sent before, after or during the generation and sending of repair symbols for a source block. Also the above description does not describe how a sender and receiver determine when to start and finish processing each source block, nor does it describe how source blocks are inter-related.

FEC codes with an atomic symbol structure of symbols (where the atomic symbol size does not vary with symbol size) are also beneficial for hardware implementations of FEC encoders/decoders. For example, if the atomic symbols are one byte, then there might be special hardware support for one-byte (or multiples of one-byte) operations that are meant to operate on atomic symbols (or multiples of atomic symbols) of symbols.

Allocating for the Number of Source Symbols

In the simple case, suppose all source blocks for all streams to be encoded all have the same number of source symbols L in each source block of each stream. In the session initiation (or using some method), a receiver would receive the value of L (and to make it simple, suppose the symbol size T is fixed for that receiver and is also communicated in the session initiation). This allows the receiver to allocate memory for each source block (L·T bytes) it is to receive. The sender can also allocate memory for each jumbo source block (L·T·n bytes if there are n streams associated with a jumbo source block).

This will now be illustrated in the following process ("Jumbo Source Block Method 2"):

A. Sender Operation

A.1. One Time Processing:
  (1) Sender is to encode n streams independently, using symbol sizes T_1, T_2, ..., T_n, respectively. Let ST_i be the sum from j=1 to i of T_j and let T=ST_n.
  (2) Sender has the value of L and T and allocates memory for and initializes a jumbo source block of size L·T bytes.
  (3) Sender generates an encoding schedule for a source block with L source symbols, where an encoding schedule includes either an implicit or explicit description of logical steps to be carried out during the encoding process that may take some significant amount of processing to determine, e.g., an encoding schedule may be a pre-computed description of the symbol operations to perform during the encoding process.

A.2. Per Source Block Processing:
  (1) Send source packets for each stream as usual, and place source symbol(s) corresponding to each source packet into the jumbo source block, i.e., a source packet for stream i is placed into the appropriate jumbo symbol(s), where within each such jumbo symbol the source symbol(s) are placed in byte positions ST_i–T_i through ST_i–1.
  (2) Once all the source symbols for the source blocks for all n streams has been received and at least logically padding symbols have been added if necessary (the jumbo source block is complete):
    (a) Execute the encoding schedule on the jumbo source block to generate the jumbo repair symbols.
    (b) Extract the repair symbols for each of the n streams from the jumbo repair symbols and send them to the appropriate stream.

B. Receiver Operation

B.1. One Time Processing:
  (1) A receiver for stream i allocates memory for source blocks of size L·T_i bytes. (It may also be advantageous to create the decoding schedule(s) that assume no packet loss, if there is a fast way to determine the final decoding schedule incrementally from these.)

B.2. Per Source Block Processing:
  (1) Receive source packets as usual and place into source block of L source symbols. At least logically add padding symbols if necessary.
  (2) Decode source block of L source symbols from received source and repair symbols.
  (3) Output K source symbols of the decoded source block to the application.

There are many variants on Jumbo Source Block Method 2. For example, the sender might keep more than one active jumbo source block at a time, and decide in some way which source packets for which streams are to be considered part of which jumbo source block. For example, two jumbo source blocks might be used and then the streams might be assigned at any point in time to one of the two jumbo source blocks, either statically or dynamically, and then as source packets for streams arrive they are placed into the assigned jumbo source block.

As another variant, instead of having the symbols for each of the streams tightly packed within a jumbo symbol there might be some spacing (non-used bits or bytes) before, after or between some or all of the symbols within a jumbo symbol. For example, symbols might be copied into a jumbo symbol and it might be faster to copy on certain alignment boundaries, e.g., on a 4 byte alignment. Thus, if the first symbol is 31 bytes in length, then there might be 1 byte between the end of the first symbol and the beginning of the second symbol in a jumbo symbol.

As another variant, it may be the case that the sender keeps the source symbols for each source block in consecutive memory, and whenever an operation on a jumbo symbol is to occur, this operation is performed logically as though the jumbo symbol is in contiguous memory but in actuality the operations take place across all the corresponding symbols within the source blocks for all the streams that are part of the jumbo symbol.

As another variant, it may be the case that the FEC code is not systematic, in which case either none or not all the source symbols are sent.

As another variant, it might be the case that in some instances some number K less than L source symbols are received for a source block when a jumbo source block is to be completed. More details on variants of this case are described below.

As another variant, indications included in the sent packets of which symbols are carried in the packets are used by the receiver to determine how received symbols were generated by a sender, e.g., an indication of which jumbo source block the received symbols were generated and exactly how they were generated.

As another variant, all source packets for all streams may be the same size, and thus each source packet corresponds to a same number of source symbols in a source block. As another variant, source packets may vary in size within a stream and/or between streams, and thus each source packet may correspond to a different number of source symbols in a source block.

As another variant, each stream can be a single original stream that is to be sent to one or more receivers, such as a MPEG2 transport stream. As another variant, each stream may be a combination of many original streams to which FEC protection is to be added as a bundle and sent to one or more receivers, where each receiver receives all the original streams in the bundle plus potentially the FEC repair stream.

As another variant, the encoding schedules are pre-computed by an off-line process and provided to all senders, and thus the process of generating an appropriate encoding schedule in step A.1.(3) of Jumbo Source Block Method 2 comprises obtaining an appropriate pre-computed encoding schedule, e.g., from cache, memory, disk, or from a remote location.

As another variant, some portions of some steps of the Per Source Block Processing at the Sender of Jumbo Source Block Method 2 can be performed concurrently instead of sequentially, e.g. the sender may be sending source packets for each stream and placing them into a jumbo source block while concurrently starting to execute the encoding schedule and generating repair symbols and extracting generated repair symbols and sending them to the appropriate stream.

As another variant, the FEC code may be non-systematic instead of systematic, i.e., some or all of the source symbols are not sent by the sender, and instead more repair symbols are sent. In this variant, the receiver may use only repair symbols to recover the original source symbols.

All of the variants described above apply to the streaming methods described below as well.

Fixed Source Block Method

A fixed source block method described herein and usable in encoders and decoders uses a source block structure with a fixed number L of source symbols to support delivery of actual source blocks with up to (but not necessarily exactly equal to) L symbols. For example, a source block structure with L=1000 source symbols can support delivery of source blocks with K=1000, 991, 832 or 771 source symbols, respectively. The fixed source block method pads out a source block with K source symbols with L-K "padding" source symbols (e.g., zero-valued source symbols) before encoding, and the same padding is performed before decoding at the decoder. The actual symbols that would be sent in a transmission protocol would be the original K source symbols and as many repair symbols generated from the source block of L source symbols as desired, but the L-K padding source symbols would not be generically sent. For the decoder to work correctly, it must have the values of both K and L to be able to properly form a source block of L symbols with the last L-K symbols padded out with zeroes.

In some circumstances it may be costly to communicate the value of K, for example for each consecutive source block in a streaming application the value of K may vary and there may be no in-band mechanism to signal the varying values of K. In this case, the value of L may be fixed to be the same for all source blocks, the value of L may be communicated or known to receivers, and then L-K padding symbols may be added to each source block and also sent as part of the encoding of the source block. This solution should be avoided if possible, as often any padding symbols that are sent are longer than and thus waste more bandwidth than sending the individual values of K for each source block. To avoid sending the padding source symbols (or for a non-systematic code, to avoid requiring reception of L repair symbols instead of just K source symbols), the value of K can be communicated for example in-band in each packet containing a repair symbol.

In the description below, the encoder and decoder are, for example, an implementation of a multi-stage chain reaction (MSCR) encoder and decoder and the streaming application uses the encoder and decoder. Examples of MSCR encoders and decoders, developed by Digital Fountain, are described in Shokrollahi (cited above) and some are marketed under the trade name "DF Raptor™". It should be understood for the purposes of this disclosure that such codes are used as just examples of multi-stage codes and the teachings of this disclosure could be used with multi-stage codes other than those codes and these teachings are not limited to use with multi-stage codes described in Shokrollahi.

There are a couple of different methods for determining the L value (or list of L values). One method is have the list of possible L values be very large (perhaps for each possible value of L) within the encoder and decoder, but then to limit the list of possible L values used by an application. For example, the encoder and decoder could be designed so that all L values in the range between 1 and 8,192 work, and an application or a particular application session of an application may only use L=1000. This method leaves a lot of flexibility for applications built on top of the encoder and decoder, but makes it hard to optimize and test the encoder/decoder, since they must support all possible values of L. It also means that the application needs to explicitly signal which values of L are being used in a particular application or application session, and thus the decision and signaling of which L values to use is explicit and exposed in the application or application session protocol.

Another method is to have the encoder and decoder support only a small list of L values, referred to herein as the "small-list method". There are several advantages to the small-list method, including the ability to optimize the encoder and decoder specifically for those L values (e.g., choosing especially good systematic indices in the case of some implementations of MSCR codes, or choosing appropriate finite field sizes and representations in the case of some implementations of Reed-Solomon codes) and the advantage of limiting the number of test cases and the amount of testing that needs to be done to validate the correctness and performance of the encoder and decoder, and some decrease in the size of the encoder and decoder software footprint (due to smaller systematic indices tables in the case of some implementations of MSCR codes or due to fewer finite field tables in the case of some implementations of Reed-Solomon codes). This does have the disadvantage that only this small list of L values could be used by applications.

Within the small-list method, there are at least a few methods to expose the list of L values to the application (and perhaps more than one could be supported in an encoder and decoder API). One method is to have applications call the encoder and decoder with the explicit L value they want to use for a source block when the source block is initialized (the L value has to be one of those in the small list of supported L values) and then when the application adds source symbols to a source block and then encodes/decodes it supplies the actual value of K to be used. This method has the advantage that it is similar to existing API designs of some implementations of an MSCR encoder/decoder, and thus it requires a very small change to the API (only change is perhaps to limit the list of valid L values when the source block is set up to one of the predefined L values, with some appropriate error behavior if the supplied L value is not in the small list of valid L values that for example might use the next larger valid L values if it exists and also return an error flag). This method exposes the API to the application only very weakly to the small list method, but still provides the application to use a specific L value of its choosing (or set of L values) for the particular application or application session.

For the small list method, one possible list of valid L-values might be as shown in FIG. 2. The list of 30 L values shown in FIG. 2 has the property that there is an increase of approximately 25% between pairs of consecutive L values.

Another possibility that provides just over 10% granularity would be as shown in FIG. 3. The pattern shown in FIG. 3 can be repeated, each time multiplying the previous pattern by a factor of ten. This variant has the property that the list contains 20*I+1 values to cover a range of number of source symbols so that the ratio of the largest number in the list and the smallest number in the list is 10 to the power I, i.e., when I=5, there are 101 values of number of source symbols in the list and the range of number of source symbols in the list could go from 10 to 1 million.

Note that the encoder and decoder must use the same L value when encoding and decoding a given source block, and thus it is crucial that the L value used by a receiving application to decode a source block is the same as the L value used by the sending application when encoding the source block. There are a few different methods of signaling the L values to be used in an application or an application session to the receiver application. One possible method is to include the L value used for each source block in-band with the actual data packets sent for that source block, e.g., in the repair packets. This is one of several reasonable methods if the L value changes frequently block to block. Generally, signaling the L value in-band wastes bandwidth if the L value remains fixed for consecutive blocks or if the L value can be derived by other means.

Another possible method is to not explicitly signal the list of which L values to use in the application session and have the receiver application automatically compute the L value to use by rounding up the number K of source symbols for a given source block to the next valid L value among the list of all valid L values built into the decoder. In this case for example if the small-list of valid L values is as shown in FIG. 2 and if K=450, then L=500 would be used and if K=700, then L=800 would be used by the receiver application. This method has the advantage that it is simple and requires no additional signaling within the application session, but it removes the possibility of allowing the sending application using an even more limited list of L values. For example, the sending application may want to use only one L value in an application session (e.g., L=1000) for all source blocks, e.g., when the number of symbols in most source blocks approaches 1000 but in some source blocks there might be only 300 source symbols, but this method does not allow that. This method also does not provide a method for signaling to the receiving application the largest source block size to be used in the application session, and thus this would need to be signaled either explicitly or implicitly using other means if this were important to the receiver application, e.g. to reserve memory resources for decoding.

Another possible method is to send a sub-list of the list of all valid L values to use in the application session in the session initiation, and then have the receiver application round up the number K of source symbols to the next L value in the session initiation sub-list. For example, the sub-list of the example list shown in FIG. 2 could be the single value 1000, and in this case if K=450 or if K=700 then L=1000 would be used by the receiver application. With this method, the largest L value in the sub-list could also signal to the receiver application an upper bound on the L value to be used in the application session, e.g., the sub-list of (500, 1000) would indicate that no source block with more than 1000 source symbols will be sent in the application session. This may be useful to a receiver application to allocate resources, e.g. memory to decode.

Strongly Systematic FEC Codes

An erasure FEC code is said to be strongly systematic if it is systematic (i.e., the original source symbols are part of the encoding) and if the amount and pattern of loss of the source symbols of the source block do not affect (except in perhaps a very limited way) the overhead curve (defined to be the decoding failure probability curve as a function of the number of symbols received beyond the number of original source symbols). For example, MSCR CODE implementations such as some of those described in Shokrollahi are erasure FEC codes that are strongly systematic FEC codes, as are Reed-Solomon codes (although the computational complexity of Reed-Solomon codes is of course an issue). If the FEC code (as an example, MSCR codes) is strongly systematic, then the behavior of this proposal in terms of the overhead curve for a source block with K source symbols that is encoded and decoded as a source block with L source symbols (with L-K padding symbols in the source block) will be essentially the same overhead curve as if it were encoded and decoded as a source block with K source symbols. Thus, the fixed source block method either using or not using the small-list method, the jumbo source block method and the other methods that use these methods are preferably used with strong systematic FEC codes.

When the actual number of source symbols per source block varies, then using the fixed source block method or the jumbo source block method or the other methods that use these methods does not necessarily work very well for non-systematic FEC codes. The receiver (knowing the values of L and K), should be able to receive approximately K encoding symbols and constrain the last L-K source symbols of the source block to be recovered to zero-valued source symbols, and then decode based on this constraint. It turns out that although in some cases it is possible to design a decoding algorithm that takes into account the constraint that some of the recovered source symbols must be zeroes, the design of the decoding algorithm is not the same as the original decoding algorithm, and generally the overhead curves for the augmented decoding algorithm are fairly significantly degraded from the overhead curves of the original decoding algorithm.

Note that for example typical constructions of systematic LDPC codes are not strongly systematic FEC codes (although they are typically systematic FEC codes), because generally they are designed for a certain amount of random loss among the source symbols and the same amount of loss among the repair symbols, and thus the amount of loss of source symbols can dramatically negatively affect the overhead curve. Thus, such FEC codes do not necessarily work well when used with the fixed source block method or the jumbo source block method or the other methods that use these methods.

General Jumbo Source Block Method

The fixed source block method is a component of a general jumbo source block method that supports many source blocks with varying symbol lengths and varying numbers of symbols per source block to all be encoded efficiently using one jumbo source block architecture, where the number of jumbo source symbols in a jumbo source block is at least the maximum of the number of source symbols in each of the original source blocks and where the jumbo source symbol size is at least the sum of the lengths of the symbol sizes of the original source blocks.

Suppose there are n source blocks with respective symbol sizes of $T\_1, T\_2, \ldots, T\_n$, respectively that are to be encoded as a single jumbo source block. Let a be the preferred alignment factors for placing symbols for each of the source blocks into the jumbo block. (Note that for many computer architectures a natural choice is that a=4 or a=8, i.e., reads/writes are cheaper if aligned on 4 or 8 byte boundaries, but if there is no penalty or little penalty for unaligned reads and writes, or if the source symbols from the source blocks are not literally moved into a jumbo source block but only logically, then a=1 could be a choice.) Let A be the preferred alignment factor for generating jumbo repair symbols from the jumbo source block (where typically but not essentially A is at least as large a power of 2 as a, e.g., if a=4, then A=4, or A=8, or A=16, or A=32, and if a=8, then A=8 or A=16, or A=32, or A=64).

Define $ST\_0=0$ and for all $i=1, \ldots, n$, define $ST\_i$ be the sum from j=1 to i of $\text{ceil}(T\_j/a) \cdot a$ (where the result of "ceil" is the smallest integer that is at least as large as the argument) and let $T=\text{ceil}(ST\_n/A) \cdot A$ be the jumbo symbol size.

Let l be the maximum over all $i=1, \ldots, n$ of $K\_i$, where $K\_i$ is the number of source symbols in source block i. Then, the number of jumbo source symbols in the jumbo source block is $L \geq l$. Generally, if more than one jumbo source block is to be encoded separately, it is sometimes preferred that L is at least as large as the largest value l over the jumbo source blocks so that the encoder can use the same encoding schedule and encoding sequence for all jumbo source blocks in the sequence. If the small-list method is used, it is sometimes preferred that each L value used for each of the jumbo source blocks is in the small list of L values and that a decoder uses the correct L value when decoding a source block that was part of the jumbo source block. As described previously in the fixed source block method, there are various ways of determining the value of L for each jumbo source block at an encoder and a decoder.

The jumbo FEC encoder has the value of L and T, and allocates memory for and initializes a jumbo source block of size L·T bytes.

For the stream with index i, each source symbol is placed into a jumbo symbol at position $ST\_(i-1)$ through position $ST\_(i-1)+T\_i-1$ within the jumbo symbol.

FIG. 4 shows an example of a filled in jumbo source block for n=3, $T\_1$=6, $T\_2$=12, $T\_3$=8, a=4, A=16, $K\_1$=5, $K\_2$=7, $K\_3$=6, L=8.

In FIG. 4, each entry corresponds to a byte (or bit, or other unit of size, depending on the context) of the jumbo source block, each row corresponds to a jumbo symbol and each column corresponds to a byte position of each jumbo symbol. The entries filled with "1" correspond to the bytes filled with source symbols of the first source block, the entries filled with "2" correspond to the bytes filled with source symbols of the second source block, and the entries filled with "3" correspond to the bytes filled with source symbols of the third source block. The entries filled with "0" correspond to entries that must be filled with the same values by both the encoder and decoder for the correct source blocks to be recovered, but the values of these entries are arbitrary, e.g., they could all be filled with zeroes. The entries filled with "x" are entries whose values do not affect the outcome of the encoding and decoding of the source blocks, and they are there for alignment purposes (if there at all).

Once the jumbo source block is full or while the jumbo source block is filling, the encoding can proceed by encoding the jumbo source block to generate jumbo repair symbols. Note that the jumbo repair symbols will have the same layout (in terms of which positions correspond to which source blocks) as the jumbo source symbols. Thus, once a jumbo repair symbol has been generated, it is a simple procedure to extract the corresponding repair symbols for each source block and send those repair symbols in packets to the receivers for the corresponding stream.

We now provide an example of a multiple source blocks being encoded using one jumbo source block structure. FIG. 5 shows some encoding statistics from runs on a (2 GHz Pentium platform running the Linux™ operating system, for example), using an implementation of the DF Raptor™ codes, measuring encoding speed for various symbol sizes T, showing speeds that do and do not include the time it takes to generate an encoding schedule. Other optimizations not shown here might be used, but the same trends in terms of relationships between encoding speeds for various choices of T still hold for typical implementations of such an encoder. All of these examples are for 3000 source symbols.

With respect to FIG. 5, consider an example where there are 64 streams that use source blocks varying between 2500 and 3000 source symbols using symbol size 32 and 10% protection. Encoding each stream independently without using the jumbo source block method or the fixed source block methods of encoding yields an encoding speed of approximately 95 Mbps, as for each source block the schedule for the varying size source block needs to be calculated and then encoding is done using 32 byte symbols. Using the jumbo source block method, these source blocks for these 64 streams could be combined into one jumbo source block with 3000 jumbo source symbols of size of 2048 bytes each, and with the encoding schedule pre-computed once and for all, thus yielding an encoding speed of approximately 678 Mbps. Thus, the overall improvement in encoding speed using the jumbo source block method in this example is approximately a factor of 7. Note that there is also the advantage that instead of having 64 different streams to consider with respect to encoding, there is instead only essentially one stream to consider (after all the symbols from the 64 individual streams have been properly placed into the jumbo source block).

Streaming Sender Methods

This section describes is a method of using systematic FEC codes (for example for implementations of MSCR codes or Reed-Solomon codes) in a streaming architecture using the jumbo source block method that provides scalability and other performance benefits.

In the simple case of one stream at the sender, suppose only one value of L is to be used for encoding and decoding a sequence of source blocks in a stream. Then, L must be an upper bound on the number of source symbols in any of the source blocks. In the session initiation (or using some method), the receiver would receive the value of L. If the value of T is fixed for all source blocks within the stream, then it may be preferable to signal the value of T used for the stream in the session initiation to each receiver that is going to receive that stream. The receiver can then use the received value of T for all source blocks within that stream. In that case, a receiver may allocate a memory buffer of L·T bytes that is to be used for each consecutive source block. The receiver may use more than one such buffer if, for example, it is receiving one source block while decoding another source block while providing the application with a previously decoded source block, and the receiver may also use other temporary memory for other purposes as well. The sender can also allocate a memory buffer of L·T bytes or more that is to be used for each consecutive source block.

If the value of T varies within the stream, then it may be preferable that the value of T is signaled for each source block in a stream, either explicitly or implicitly, to a receiver that is going to receive and decode that stream. In that case, the sender and/or receiver may be able to deduce an upper bound on the largest T valued used for any of the source blocks if it wants to preallocate buffers that are large enough for all the source blocks to be processed.

An Example Stream Sender Operation

A. One Time Processing:
(1) Sender has the value of L and T, and allocates memory buffer sufficient to process source blocks of size L·T bytes.
(2) Sender generates the encoding schedule for a source block with L source symbols.

B. Per Source Block Processing:
(1) Send source packets as usual and place into source block of L source symbols.
(2) When the source block is completed with K source symbols (where the value of K may vary from source block to source block but is at most L),
  (a) Pad the source block with L-K zero-valued source symbols (at least logically, and this may be done initially as well).
  (b) Generate repair symbols (optimized to possibly skip steps that involve the padding source symbols, and this may be done incrementally as source symbols are added to the source block)
  (c) Send the repair symbols in repair packets (which may include the value of K).

There are many variants of the above, including executing the steps concurrently with one another in an overlapping fashion instead of sequentially as described above, e.g., the step of generating repair symbols may occur concurrently with the step of receiving and sending source packets for a source block, and the step of generating repair symbols for a source block may occur concurrently with the step of sending repair symbols in repair packets for a source block. Furthermore, the processing steps described above for a source block may be concurrent or overlaps with the same steps for a different source block.

The above steps can be used independently of which FEC code is used, e.g. it could be an implementation of an MSCR CODE or it could be an implementation of a Reed-Solomon code or an implementation of some other FEC code. Another variant on the above is to use a non-systematic FEC code, where none or not all of the source symbols are sent.

Simple Receiver Operation

A. One Time Processing:
  (1) Receiver has the value of L and T, and allocates memory sufficient for processing source blocks of size L·T bytes.
  (2) It may also be good to create the decoding schedule(s) that assume no packet loss, if there is a fast way to determine the final decoding schedule incrementally from these.

B. Per Source Block Processing:
  (1) Receive source packets and place into source block of L source symbols.
  (2) Receiver repair packets for a source block.
  (3) Receive the value of K (for example, the value of K may be contained in repair packets).
  (4) Pad the source block with L-K zero-valued source symbols (at least logically).
  (5) Decode source block of L source symbols from received source and repair symbols (don't need to regenerate padding source symbols, but it is important that they are part of the source block in the decoding process, at least logically. However steps where padding source symbols are involved can be skipped for speed optimization purposes)
  (6) Output K source symbols of decoded source block.

A more sophisticated variant of the simple protocol above would to use a small-list method, i.e., use a small list of several values of L that are well-spaced, e.g., L=100, 150, 200, 250, 300, 400, 500, 650, 800, 1000, and communicate these values to both the sender and receiver. Then, the source block size used for encoding/decoding a source block of K source symbols is the smallest value of L in the list such that K≦L. For example, with respect to the list of L values above, then if K=133 then L=150 would be used, whereas if K=900 then L=1000 would be used. This provides some advantages further described below.

Multiple Streams Sender Operation Using Jumbo Source Block Method

An example of a jumbo source block method using one L value and one T value for n streams is now described for streaming multiple streams from a sender. Variations of this method using the small-list method where different L values and T values are used for different jumbo source blocks and the source blocks within them can be easily derived from this description. Variations of this method can also be made where the number of streams that are being included in a jumbo source block varies from one jumbo source block to the next, where there is more than one jumbo source block that is being processed concurrently.

One Time Processing:
  (1) Sender is to encode n streams independently, using potentially different symbol sizes for each stream with the number of jumbo source symbols for the jumbo source block is fixed to L and the jumbo symbol size fixed to T bytes.
  (2) Sender allocates memory sufficient for processing and initializes a jumbo source block of size L·T bytes.
  (3) Sender generates an encoding schedule for a source block with L source symbols, where an encoding schedule includes either an implicit or explicit description of logical steps to be carried out during the encoding process that may take some significant amount of processing to determine. An encoding schedule may be a pre-computed description of the symbol operations to perform during the encoding process.

Per Source Block Processing:
  (4) Send source packets for each stream as usual, and place source symbol(s) corresponding to each source packet into the jumbo source block as described in the jumbo source block method, adding padding symbols and padding to symbols at least logically if needed.
  (5) Once all the source symbols for the source blocks for all n streams has been placed into the jumbo source block (the jumbo source block is complete), or while the jumbo source block is being filled:
    (a) Execute the encoding schedule on the jumbo source block to generate the jumbo repair symbols (part of this may occur in parallel with filling the jumbo source block).
    (b) Extract the repair symbols for each of the n streams from the jumbo repair symbols and send them to the appropriate stream.

For some FEC code implementations, there may not be an explicit encoding schedule that is generated. Nevertheless, the same encoding operations are typically performed on each jumbo source block for the same L and T value, excluding optimizations that avoid explicit processing of padding symbols or the padding in symbols. For some FEC code implementations where an explicit encoding schedule is used, the explicit encoding schedule may be for example computed off-line once and for all for each relevant L value at a separate site and distributed along with the FEC encoding software and/or hardware to the sender, and then in step (3) of the One Time Processing the appropriate encoding schedule for the particular L value used for that jumbo source block is accessed by the encoder.

Receiver Operation

A. One Time Processing:
  A receiver for stream i allocates memory for source blocks with L source symbols with the appropriate symbol size for the stream. (It may also be advantageous to create the decoding schedule(s) that assume no packet loss, if there is a fast way to determine the final decoding schedule incrementally from these.)

B. Per Source Block Processing:
  (1) Receive source packets as usual and place into source block of L source symbols.
  (2) The last L-K symbols of the source block are considered logically to be zeroes (or any other set of values agreed upon between sender and receiver), where K is the number of source symbols in the source block.
  (3) Decode source block of L source symbols from received source and repair symbols (potentially ignoring operations that involve the last L-K source symbols).
  (4) Output first K source symbols of decoded source block to the application.

As an example of one variant, many of the steps described above can be processed concurrently. For example, in the "multiple streams sender" operation, the sending of source packets can occur concurrently with the generation and sending of repair packets. As another example, the one-time processing steps may be either skipped or occur concurrently with some of the other steps in some implementations. As another example, the receiver steps of receiving packets and performing decoding may overlap. For some implementations of FEC codes, the code may be non-systematic, in which case none or not all of the source symbols from source blocks are sent or received.

As an example of one variant, instead of having just one jumbo source block, at any point in time, the sender actively maintains multiple jumbo source blocks, and streams are either dynamically or statically allocated to different jumbo source blocks over time. For example, there may be ten jumbo source blocks and each stream is statically assigned to one of the jumbo source blocks. Then, for example, each 10 ms one of the ten jumbo source blocks is declared full, processed, and reinitialized, and this happens in a round-robin fashion so that each jumbo source block contains 100 ms of source data.

As another variant, streams are dynamically assigned to jumbo source blocks, and streams may vary symbol size for each source block. In this variant, jumbo source block may stay the same size but its internal structure in terms of symbol sizes and symbol boundaries may vary. As an example, each stream may have source blocks formed on group of picture (GoP) boundaries, and the time between consecutive GoPs may be different for different source blocks. For example, there may be ten active jumbo source blocks, and each stream is dynamically assigned to a new jumbo block each time a GoP is completed (which completes its current source block) and a new GoP starts for that stream, in which case the new source block started is part of the currently assigned jumbo block for that stream.

The value of T could vary from source block to source block within a stream or between streams. If the value of T is fixed for all source blocks within a stream (but the value of T still may vary between streams) then it may be preferable in some embodiments to signal the value of T used for the stream in the session initiation to each receiver that is going to receive that stream and the receiver uses the received value of T for all source blocks within that stream. If the value of T varies within a stream then it may be preferable that the value of T is signaled for each source block in a stream either explicitly or implicitly to any receiver that is going to receive and decode that stream.

One clear advantage of the simple proposal is that the FEC sender/encoder uses the same number of source symbols L for each source block, and thus the encoding schedule can be computed once at startup time and then reused for each source block. This can be a substantial advantage in the CPU resources needed at the sender (since creating the schedule can be a significant amount of the overall encoding time). Furthermore, this allows more time to be devoted to the computation of the schedule which in turn allows more advanced algorithms to be used, resulting in a schedule which is quicker to execute when needed.

Another advantage is that the design of the code and its properties only need to be verified for one value of the number of source symbols, i.e., for the value of L. This means for example there is only one systematic index of interest for some implementations of MSCR encoders/decoders, and thus the size of the systematic indices is dramatically reduced (even if there are a small set of them, instead of just one). This also means that, for some implementations of MSCR encoders/decoders, the time spent choosing the best systematic index can be much less (there is only one or a small number to choose, instead of thousands), thus leading to better code performance in terms of number of inactivations, encoding/decoding speeds and overhead curves. Similar approaches are possible with other FEC codes. For example, some implementations of Reed-Solomon codes only require certain finite field tables to be built.

Another advantage is that the encoder can be optimized for one particular value of L. In an extreme case, this means that the encoding algorithm can be burnt into silicon, but even when it is a software embodiment there are various optimizations that one can potentially do if restricted to one value (or a small number of values) of L instead of dealing with thousands of values of K.

Another clear advantage is for a sender/encoder that is potentially dealing with thousands of simultaneous streams for different content (for example, a highly scalable FEC server for live or on-demand content) that could use the same source block structure for all source blocks, even if each individual source block has a different number of source symbols. As a simple example, there could be three streams with the current source block sizes of 900, 780 and 850 source symbols, respectively, with the value of L=1000. In this case, all three source blocks could be encoded as a single jumbo block with 1000 source symbols and each jumbo symbol consisting of 3*T bytes (assuming that all three streams use the same symbol size T, which is not essential to this example). The first source block is padded with 100 zero-valued source symbols, the second with 220 zero-valued source symbols and the third with 150 zero-valued source symbols that make up the jumbo source symbols in the jumbo block.

In this case, the encoding schedule for the jumbo source block is always the same independent of the number of source symbols in each of the actual source blocks, and thus computing the encoding schedule can be skipped. Also, the logic of executing the encoding schedule on each of the source blocks is only done once for the jumbo block, leading to efficiencies in computation. In this example, repair jumbo symbols for the three different streams would be placed into different packets after generation and sent individually to different receivers of the three different streams.

Another advantage is that the decoder can be optimized to decode particularly efficiently for the value of L (or small number of values of L) of interest. There are various optimizations that can potentially be done for a particular value of L that would be infeasible for thousands of values of L.

Another advantage is that the source blocks can be variable size, i.e., aligned on GoP boundaries with varying-sized GoPs, and still the encoding and decoding algorithms are applied to source blocks of fixed-size. Thus, all the advantages spelled out above are realized even when the actual source blocks in the stream (or multiple streams) are widely varying. This means that the design of the encoding/decoding processes and their efficiencies are largely independent of the choice of the source block sizes of the stream(s), which is a clear architectural advantage.

There are some potential disadvantages that turn out to either be insignificant or small. One disadvantage is that the size of the source block that is encoded and decoded can be larger than actual size of the source block to be transmitted, and thus may take more time to encode/decode than if the actual value of K were used instead of L. However, if the value of L is chosen to be approximately equal to the largest source block in the stream, then the resources needed are not significantly more than they would be for encoding/decoding this largest source block using the streaming solution described in the 3GPP Specification. This disadvantage is further ameliorated if several values of L are used instead of just one, as then the relative size of the source block that is encoded/decoded can be arbitrarily close (depending on how many L values there are in the list) to the actual size of the source block. Also, optimizations may skip steps that involve the padding source symbols and the processing of any padding within a source symbol, and thus the time to encode/decode may be almost the same as if though K were used instead of a larger L value.

Another potential disadvantage is the memory requirements required at the encoder/decoder for the source blocks that are smaller than the source block structure size. This generally is not a disadvantage, since generally the memory for holding source blocks is allocated at the beginning to be large enough to hold the largest source block and then this memory is reused again and again for consecutive source blocks, and thus the memory for source blocks can be allocated one time at the beginning that will be sufficient for handling all source blocks, and thus no more memory is required than for the streaming solution described in the 3GPP Specification.

Another potential disadvantage is that the overhead curve is worse for the value of L used than it would have been for the actual number K of source symbols in the source block. However, for strongly systematic FEC codes (such as Reed-Solomon codes, MSCR codes) the overhead curves are essentially the same for K and for L, and thus there is no disadvantage to using L as the number of source symbols rather than K.

Overall, the preferred method for streaming is most likely to use a small list of values of L, which is especially relevant to applications, where the number of (potentially different) streams that the sender/encoder is designed to handle can be quite large.

Object/File Delivery Methods

What is also proposed is a slight modification of the method in which FEC codes are used in the FLUTE/ALC/FEC file/object delivery architecture that uses the jumbo source block method and that provides some performance and other benefits. As with the streaming methods, the methods and processes described herein for file/object delivery can use FEC codes as already specified in the IETF standards as well as any other FEC codes.

In the FLUTE/ALC/FEC architecture, when a file is to be partitioned into more than one source block, using the partitioning algorithm defined in the FEC building block results in source blocks with potentially two different numbers of source symbols, i.e., K source symbols in the smaller blocks and K+1 source symbols in the large blocks. The method proposed here is to use the same partitioning algorithm into source blocks, but then to do the encoding using only the larger of the two values, i.e., use a source block structure with $L \geq K+1$ source symbols when encoding/decoding all source blocks. This means that the smaller source blocks with K source symbols are padded out with one more -padding symbol than the larger source blocks with K+1 source symbols before encoding/decoding.

One advantage of this method is that the sender/encoder only needs to determine one encoding schedule (for the value L) when encoding the file/object instead of two encoding schedules. Another advantage is that at the decoder it might be possible to incrementally build a decoding schedule for one source block from the decoding schedule of any other source block very efficiently especially in the case when the loss patterns between the two source blocks are similar. This can work because all source block structures have the same number L of source symbols.

A more sophisticated variant is to use a selected list of pre-computed L values (similar to the small-list methods for streaming), i.e., if the source block sizes for the object are K and K+1 as computed by the partitioning algorithm, then find the smallest L in the list of L-values that is at least K+1 and use this value for the source block structure for all source blocks in the object. This more sophisticated method has many of the same advantages/disadvantages as listed for the streaming proposal in a previous section.

Another variant is to use the L value for the source blocks with K source symbols and possibly a larger L-value for source blocks with K+1 source symbols, e.g., if K is a supported L value then this is used as the L value for the smaller source blocks whereas a larger L value is used for the larger source blocks. This variant has the advantage that the processing of the smaller source blocks with K source symbols may be slightly more efficient due to the lack of padding symbols in these source blocks, and the disadvantage of requiring two different encoding schedules (either explicit or implicit sequences of operations needed to encode) for the two different sized source blocks.

Storage Methods

The methods above can be extended to apply to storage applications. For example, each symbol may be a sector (or partial sector) on a disk drive, and FEC codes may be applied over a variable number of sectors (a source block). Then, specialized hardware encoders/decoders can be developed for a specific value of L instead of for a large range of possible values of K.

Example Module

Figure 6:
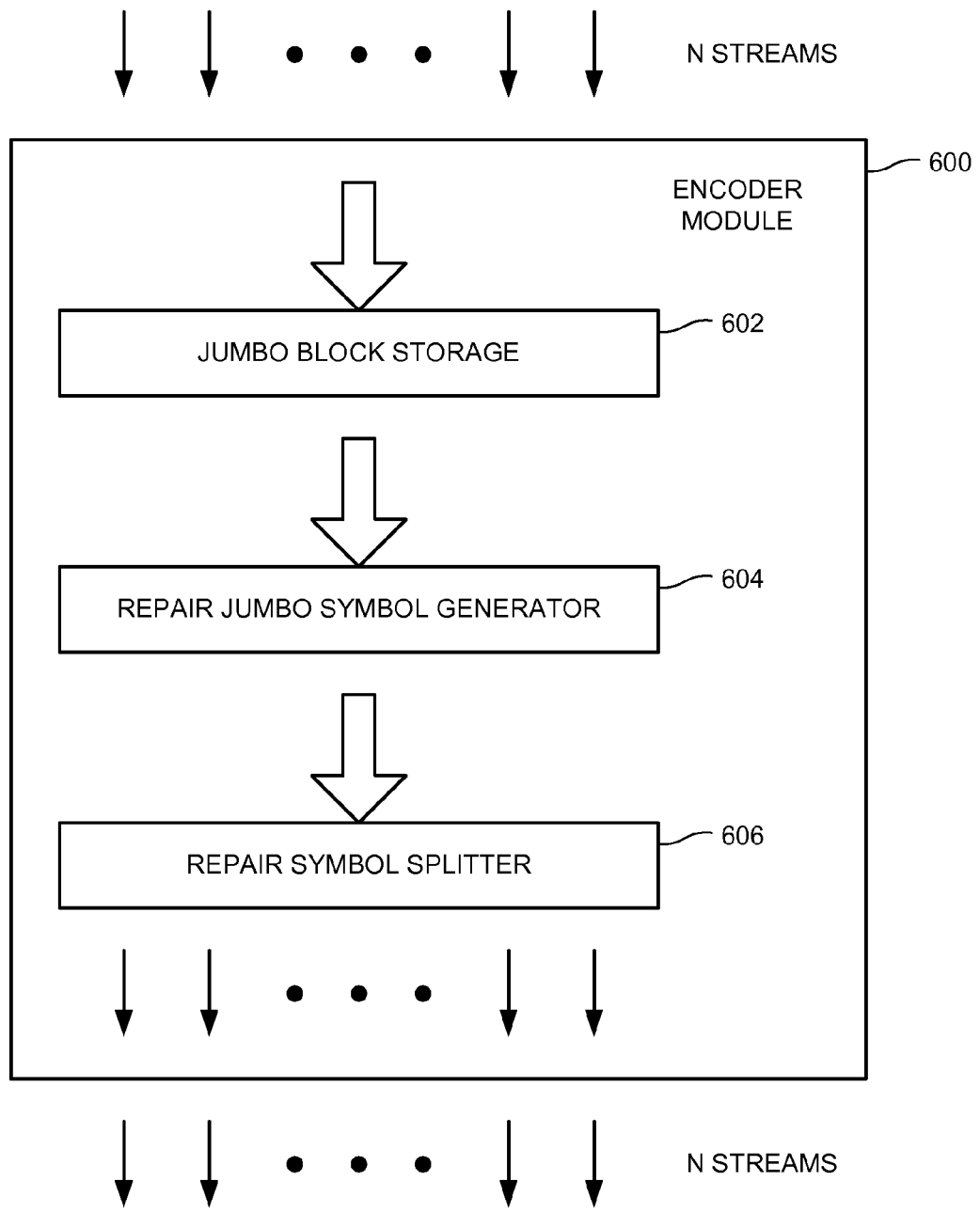
FIG. 6 is a block diagram of an encoder module for generating repair symbols from a jumbo source symbol.

FIG. 6 is a block diagram of an encoder module for generating repair symbols from a jumbo source symbol. As shown there, an encoder module 600 receives a plurality, N, of streams, which is described above in detail. Within encoder module 600, a jumbo block storage 602 is used to store a plurality of source symbols from the N streams (or less than all of the N streams). A repair jumbo symbol generator 604 generates jumbo repair symbols as part of a jumbo repair block from the jumbo block(s) stored in storage 602. A repair symbol splitter 606 splits those generated repair jumbo symbols so that they can be output on separate streams.

Codes

Unless otherwise indicated, a wide variety of codes can be used. For example, MSCR codes can be used, wherein an encoder operates on an ordered set of input symbols and may generate zero or more redundant symbols from input symbols and generate a plurality of output symbols from the combined set of symbols including the input symbols, and the redundant symbols if there are any redundant symbols. The methods and apparatus described herein might be used to generate output symbols wherein the number of possible output symbols that can be generated from a fixed set of input symbols is independent of the number of input symbols, typically much larger.

While the invention has been described with respect to exemplary embodiments, one skilled in the art will recognize that numerous modifications are possible. For example, the methods and processes described herein may be implemented using hardware components, software components, and/or any combination thereof. Thus, although the invention has been described with respect to exemplary embodiments, it will be appreciated that the invention is intended to cover all modifications and equivalents within the scope of the following claims.

What is claimed is:

1. In a streaming communication system including transmitters and receivers that deal with concurrent streams, a method comprising:
    associating source symbols over a plurality of streams as a jumbo source symbol;
    grouping jumbo source symbols into at least one active jumbo source block;

generating from the at least one active jumbo source block jumbo repair symbols as part of at least one jumbo repair block using an FEC process; and sending the concurrent streams from a transmitter to a receiver with data representing the at least one jumbo repair block.

2. The method of claim 1, wherein each jumbo repair block is organized as jumbo repair symbols wherein each jumbo repair symbol is divisible into a plurality of repair symbols, each of which depends only on source symbols of a single stream.

3. The method of claim 1, further comprising assigning memory locations such that FEC processing for generating jumbo repair blocks requires fewer move operations than another memory allocation.

4. The method of claim 1, wherein the jumbo source symbols are of constant size.

5. The method of claim 1, wherein the jumbo source symbols are suitably aligned along size boundaries that make processing efficient.

6. The method of claim 1, wherein the number of source symbols from each stream for a jumbo source symbol varies over the streams.

7. The method of claim 1, wherein the FEC process uses a non-systematic FEC code.

8. The method of claim 1, wherein at least two of the associating, grouping, generating, and sending are performed concurrently.

9. The method of claim 1, wherein grouping jumbo source symbols into the at least one active jumbo source block comprises:

assigning at least one stream of the plurality of streams to each of a plurality of active jumbo source blocks; and grouping jumbo source symbols into the plurality of active jumbo source blocks, wherein the jumbo source symbols grouped into a particular active jumbo source block are associated with source symbols over the at least one stream assigned to the particular active jumbo source block.

10. The method of claim 9, wherein the streams are dynamically assigned to the active jumbo source blocks.

11. In a streaming communication system including transmitters and receivers that deal with concurrent streams, an apparatus comprising:

an encoder module configured to associate source symbols over a plurality of streams as a jumbo source symbol, group jumbo source symbols into at least one active jumbo source block; and generate from the at least one active jumbo source block jumbo repair symbols as part of at least one jumbo repair block using an FEC process; and a transmit module configured to send the concurrent streams from a transmitter to a receiver with data representing the at least one jumbo repair block.

12. The apparatus of claim 11, wherein each jumbo repair block is organized as jumbo repair symbols wherein each jumbo repair symbol is divisible into a plurality of repair symbols, each of which depends only on source symbols of a single stream.

13. The apparatus of claim 11, wherein the encoder module is further configured to assign memory locations such that FEC processing for generating jumbo repair blocks requires fewer move operations than another memory allocation.

14. The apparatus of claim 11, wherein the jumbo source symbols are of constant size.

15. The apparatus of claim 11, wherein the jumbo source symbols are suitably aligned along size boundaries that make processing efficient.

16. The apparatus of claim 11, wherein the number of source symbols from each stream for a jumbo source symbol varies over the streams.

17. The apparatus of claim 11, wherein the FEC process uses a non-systematic FEC code.

18. The apparatus of claim 11, wherein the encoder module is configured to perform concurrently at least two of the associating, grouping, and generating.

19. The apparatus of claim 11, wherein the encoder module is further configured to assign at least one stream of the plurality of streams to each of a plurality of active jumbo source blocks, such that the jumbo source symbols grouped into a particular active jumbo source block are associated with source symbols over the at least one stream assigned to the particular active jumbo source block.

20. The apparatus of claim 19, wherein the encoder module is configured to dynamically assign the streams to the active jumbo source blocks.

21. In a streaming communication system including transmitters and receivers that deal with concurrent streams, a system comprising:

encoding means for associating source symbols over a plurality of streams as a jumbo source symbol, grouping jumbo source symbols into at least one active jumbo source block; and generating from the at least one active jumbo source block jumbo repair symbols as part of at least one jumbo repair block using an FEC process; and transmit means for sending the concurrent streams from a transmitter to a receiver with data representing the at least one jumbo repair block.

22. The system of claim 21, wherein each jumbo repair block is organized as jumbo repair symbols wherein each jumbo repair symbol is divisible into a plurality of repair symbols, each of which depends only on source symbols of a single stream.

23. The system of claim 21, wherein the encoding means include means for assigning memory locations such that FEC processing for generating jumbo repair blocks requires fewer move operations than another memory allocation.

24. The system of claim 21, wherein the jumbo source symbols are of constant size.

25. The system of claim 21, wherein the jumbo source symbols are suitably aligned along size boundaries that make processing efficient.

26. The system of claim 21, wherein the number of source symbols from each stream for a jumbo source symbol varies over the streams.

27. The system of claim 21, wherein the FEC process uses a non-systematic FEC code.

28. The system of claim 21, wherein the encoding means include means for performing concurrently at least two of the associating, grouping, and generating.

29. The system of claim 21, wherein the encoding means further include means for assigning at least one stream of the plurality of streams to each of a plurality of active jumbo source blocks, such that the jumbo source symbols grouped into a particular active jumbo source block are associated with source symbols over the at least one stream assigned to the particular active jumbo source block.

30. The system of claim 29, wherein the encoding means include means for dynamically assigning the streams to the active jumbo source blocks.

31. A computer program product in a streaming communication system including transmitters and receivers that deal with concurrent streams, the product comprising:
- a processor-readable medium storing processor-readable instructions configured to cause a processor to:
  - associate source symbols over a plurality of streams as a jumbo source symbol;
  - group jumbo source symbols into at least one active jumbo source block;
  - generate from the at least one active jumbo source block jumbo repair symbols as part of at least one jumbo repair block using an FEC process; and
  - provide for sending from a transmitter to a receiver the concurrent streams with data representing the at least one jumbo repair block.

32. The computer program product of claim 31, wherein each jumbo repair block is organized as jumbo repair symbols wherein each jumbo repair symbol is divisible into a plurality of repair symbols, each of which depends only on source symbols of a single stream.

33. The computer program product of claim 31, wherein the instructions are further configured to cause the processor to assign memory locations such that FEC processing for generating jumbo repair blocks requires fewer move operations than another memory allocation.

34. The computer program product of claim 31, wherein the jumbo source symbols are of constant size.

35. The computer program product of claim 31, wherein the jumbo source symbols are suitably aligned along size boundaries that make processing efficient.

36. The computer program product of claim 31, wherein the number of source symbols from each stream for a jumbo source symbol varies over the streams.

37. The computer program product of claim 31, wherein the FEC process uses a non-systematic FEC code.

38. The computer program product of claim 31, wherein the instructions are further configured to cause the processor to perform concurrently at least two of the associating, grouping, generating, and providing.

39. The computer program product of claim 31, wherein the instructions are further configured to cause the processor to:
- assign at least one stream of the plurality of streams to each of a plurality of active jumbo source blocks, such that the jumbo source symbols grouped into a particular active jumbo source block are associated with source symbols over the at least one stream assigned to the particular active jumbo source block.

40. The computer program product of claim 39, wherein the instructions are further configured to cause the processor to dynamically assign the streams to the active jumbo source blocks.

* * * * *